(12) United States Patent
Chu et al.

(10) Patent No.: US 12,532,547 B2
(45) Date of Patent: Jan. 20, 2026

(54) DISPLAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Zhiwen Chu, Beijing (CN); Bo Zhang, Beijing (CN); Yi Qu, Beijing (CN); Xinxin Wang, Beijing (CN); Aoyuan Feng, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 464 days.

(21) Appl. No.: 18/015,541

(22) PCT Filed: Feb. 25, 2022

(86) PCT No.: PCT/CN2022/078082
§ 371 (c)(1),
(2) Date: Jan. 11, 2023

(87) PCT Pub. No.: WO2023/159516
PCT Pub. Date: Aug. 31, 2023

(65) Prior Publication Data
US 2024/0243136 A1    Jul. 18, 2024

(51) Int. Cl.
*H10D 89/60* (2025.01)
*H10D 86/40* (2025.01)

(52) U.S. Cl.
CPC ......... *H10D 89/931* (2025.01); *H10D 86/441* (2025.01)

(58) Field of Classification Search
CPC .................... H10D 89/931; H10D 86/441
See application file for complete search history.

(56) References Cited

U.S. PATENT DOCUMENTS

2005/0162581 A1    7/2005  Lim et al.
2014/0111496 A1    4/2014  Gomez et al.
(Continued)

FOREIGN PATENT DOCUMENTS

CN          1629704 A      6/2005
CN        104732908 A      6/2015
(Continued)

*Primary Examiner* — Peter M Albrecht
(74) *Attorney, Agent, or Firm* — Ling Wu; Stephen Yang; Ling and Yang Intellectual Property

(57) ABSTRACT

A display substrate and a display apparatus are provided. The display substrate includes: a display area and a non-display area located around the display area, wherein the non-display area includes: at least one Electro-Static discharge (ESD) protection unit, each ESD protection unit includes: multiple transistors connected in series, a first electrode of each transistor is connected with a gate, and the multiple transistors are arranged along a first inclination direction, a first preset included angle is provided between the first inclination direction and a first direction, the first preset included angle ranges from 10° to 80°, and the first direction is an extending direction of a gate line in the display area.

12 Claims, 8 Drawing Sheets

(56) References Cited

U.S. PATENT DOCUMENTS

| | | |
|---|---|---|
| 2016/0232837 A1 | 8/2016 | Lee |
| 2017/0160607 A1 | 6/2017 | Zhao et al. |
| 2017/0242311 A1 | 8/2017 | Li et al. |
| 2019/0043414 A1* | 2/2019 | Wu .................. G09G 3/2092 |
| 2020/0381458 A1 | 12/2020 | Yang et al. |
| 2021/0134936 A1 | 5/2021 | Chang et al. |
| 2021/0343203 A1 | 11/2021 | Nie |

FOREIGN PATENT DOCUMENTS

| | | | | |
|---|---|---|---|---|
| CN | 104965369 A | | 10/2015 | |
| CN | 106611762 A | | 5/2017 | |
| CN | 106773410 A | | 5/2017 | |
| CN | 109742128 A | | 5/2019 | |
| CN | 110060621 A | | 7/2019 | |
| CN | 110085118 A | * | 8/2019 | .............. G09F 9/00 |
| CN | 110223991 A | | 9/2019 | |
| CN | 110706607 A | | 1/2020 | |
| CN | 111223436 A | | 6/2020 | |
| CN | 111584510 A | | 8/2020 | |
| CN | 111599847 A | | 8/2020 | |
| JP | 2009116116 A | | 5/2009 | |
| KR | 1020080001062 A | | 1/2008 | |
| KR | 1020170003088 A | | 1/2017 | |
| KR | 1020200082181 A | | 7/2020 | |

\* cited by examiner

DISPLAY SUBSTRATE AND DISPLAY APPARATUS

CROSS-REFERENCE TO RELATED APPLICATION

The present application is a U.S. National Phase Entry of International Application No. PCT/CN2022/078082 having an international filing date of Feb. 25, 2022, the content of which is incorporated into this application by reference.

TECHNICAL FIELD

Embodiments of the present disclosure relate to, but are not limited to, the field of display technologies, and particularly to a display substrate and a display apparatus.

BACKGROUND

In a process for preparing a display substrate (such as an array substrate), Electro-Static discharge (ESD) is easy to occur on the display substrate, which causes damage to traces or circuits on the display substrate. Therefore, in order to avoid ESD damage, an ESD protection unit is usually disposed on the display substrate. However, layout solutions of ESD protection units in some technologies are not conducive to efficient use of a wiring space.

SUMMARY

The following is a summary of subject matters described herein in detail. The summary is not intended to limit the protection scope of claims.

In an aspect, an embodiment of the present disclosure provides a display substrate, including: a display area and a non-display area located around the display area, wherein the non-display area includes: at least one Electro-Static discharge (ESD) protection unit, each ESD protection unit includes: multiple transistors connected in series, a first electrode of each transistor is connected with a gate, and the multiple transistors are arranged along a first inclination direction, a first preset included angle is provided between the first inclination direction and a first direction, the first preset included angle ranges from 10° to 80°, and the first direction is an extending direction of a gate line in the display area.

In another aspect, an embodiment of the present disclosure also provides a display apparatus, including: the display substrate in the aforementioned embodiment.

Other features and advantages of the present disclosure will be elaborated in the following specification, and moreover, partially become apparent from the specification or are understood by implementing the present disclosure. Other advantages of the present disclosure may be achieved and obtained through solutions described in the specification and drawings.

Other aspects may be understood after the drawings and the detailed description are read and understood.

BRIEF DESCRIPTION OF DRAWINGS

The drawings are used for providing understanding of technical solutions of the present disclosure, constitute a part of the specification, and together with the embodiments of the present disclosure, are used for explaining the technical solutions of the present disclosure but do not form limitations on the technical solutions of the present disclosure. Shapes and sizes of each component in the drawings do not reflect actual scales, and are only intended to schematically illustrate contents of the present disclosure.

DETAILED DESCRIPTION

Figure 1A:
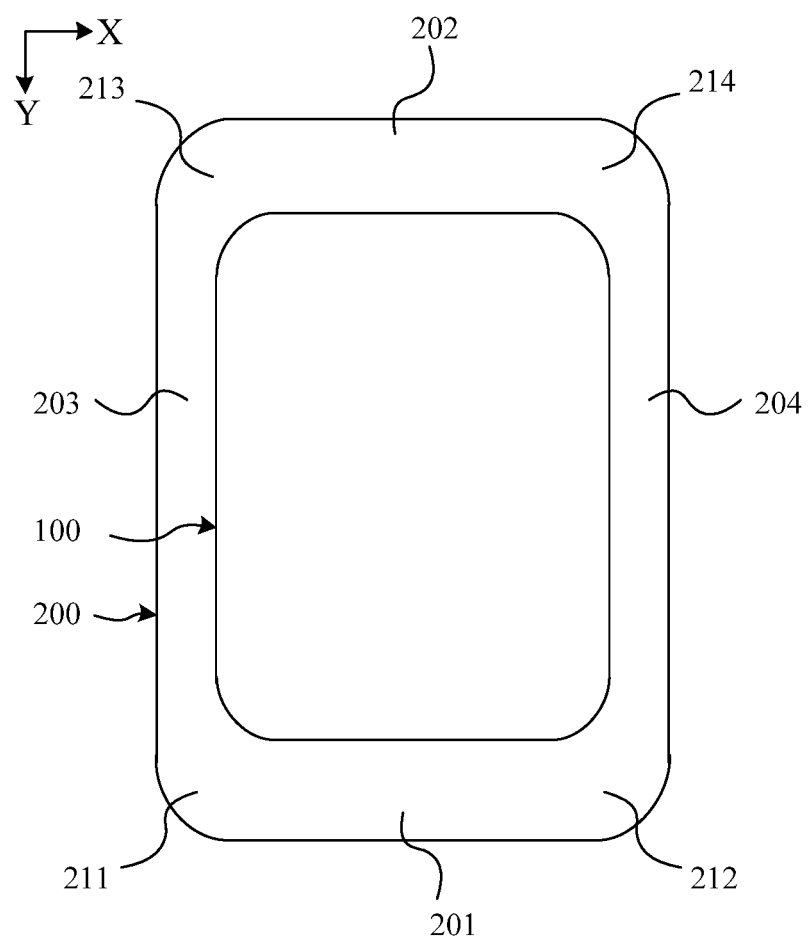
FIG. 1A is a schematic diagram of a structure of a display substrate.

Multiple embodiments are described in the present disclosure. However, the description herein is exemplary and unrestrictive, and more embodiments and implementation solutions are possible within a scope contained in the embodiments described herein. Although many possible feature combinations are shown in the drawings and discussed in exemplary implementation, many other combinations of the disclosed features are possible. Unless expressly limited, any feature or element of any embodiment may be used in combination with, or may replace, any other feature or element in any other embodiment.

When a representative embodiment is described, a method or process may have already been presented in a specific sequence of acts in the specification. However, to an extent that the method or process does not depend on a specific sequence of the acts herein, the method or process should not be limited to the acts in the specific sequence. As will be understood by those of ordinary skill in the art, other sequences of acts are possible. Therefore, the specific sequence of the acts illustrated in the specification should not be interpreted as a limitation on claims. In addition, the claims with respect to the method or process should not be limited to execute their acts according to the written sequence. Those skilled in the art may easily understand that these sequences may change, and are still maintained in the spirit and scope of the embodiments of the disclosure.

In the drawings, a dimension of each constituent element, a thickness of a layer, or an area is exaggerated sometimes for clarity. Therefore, an implementation of the present disclosure is not necessarily limited to the size shown, and a shape and size of each component in the drawings do not reflect true proportions. In addition, the drawings schematically illustrate ideal examples, and one implementation of the present disclosure is not limited to the shapes, numerical values, or the like shown in the drawings.

Ordinal numerals such as "first", "second", and "third" in the specification are set to avoid confusion of constituent elements, but not to set a limit in quantity.

In the specification, for convenience, expressions indicating orientation or positional relationships, such as "center", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element has a particular orientation and is structured and operated in the particular orientation. Therefore, they cannot be understood as limitations on the present disclosure. The positional relationships between the constituent elements may be changed as appropriate according to a direction which is used for describing each constituent element. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, or a detachable connection, or an integrated connection. It may be a mechanical connection or an electrical connection. It may be a direct connection, or an indirect connection through middleware, or an internal communication between two components. Those of ordinary skills in the art may understand meanings of the above-mentioned terms in the present disclosure according to situations.

In the specification, "electrical connection" includes a case that constituent elements are connected together through an element with a certain electrical effect. The "element with the certain electrical effect" is not particularly limited as long as electrical signals may be sent and received between the connected constituent elements. For example, "the element with the certain electrical effect" may be an electrode or wiring, or a switch element, such as a transistor, or other functional elements, such as a resistor, an inductor, a capacitor, or the like.

In the specification, a transistor refers to an element that at least includes three terminals, i.e., a gate electrode (gate or control electrode), a drain electrode (drain electrode terminal, drain area, or drain), and a source electrode (source electrode terminal, source area, or source). A transistor has a channel area between a drain electrode and a source electrode, and a current can flow through the drain electrode, the channel area, and the source electrode. It is to be noted that, in the specification, the channel area refers to an area through which the current mainly flows.

In the specification, in order to distinguish two electrodes of a transistor other than a gate electrode (gate or control electrode), one of the two electrodes is directly described as a first electrode, while the other is described as a second electrode. The first electrode may be a drain electrode, and the second electrode may be a source electrode. Or, the first electrode may be a source electrode, and the second electrode may be a drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the specification.

Transistors in the embodiments of the present disclosure may be Thin Film Transistors (TFTs), or Field Effect Transistors (FETs), or other devices with same characteristics. For example, a thin film transistor used in the embodiments of the present disclosure may include, but is not limited to, an oxide TFT or a Low Temperature Poly-silicon TFT (LTPS TFT). Here, no limitation is made thereto in the embodiments of the present disclosure.

In the specification, "parallel" refers to a state in which an angle formed by two straight lines is above $-10°$ and below $10°$, and thus also includes a state in which the angle is above $-5°$ and below $5°$. In addition, "perpendicular" refers to a state in which an angle formed by two straight lines is above $80°$ and below $100°$, and thus also includes a state in which the angle is above $85°$ and below $95°$.

In the present disclosure, "about" refers to that a boundary is defined not so strictly and numerical values within process and measurement error ranges are allowed.

An "integral structure" in embodiments of the present disclosure may refer to a structure formed by two (or more) structures which are formed by the same deposition process and are patterned by the same composition process so as to connect to each other, and their materials may be the same or different.

In an embodiment of the present disclosure, a first direction X may refer to an extending direction of a grid line in a display area or a horizontal direction, a second direction Y may refer to an extending direction of a data line in the display area or a vertical direction, and a third direction Z may refer to a direction perpendicular to a plane of a display substrate or a thickness direction of a display substrate, etc. Herein, the first direction X and the second direction Y may be perpendicular to each other, and the first direction X and the third direction Z may be perpendicular to each other.

In order to facilitate better understanding of technical solutions of the present disclosure by those skilled in the art, technical terms that may be involved in exemplary embodiments of the present disclosure are briefly described below.

Electro-Static discharge (ESD) refers to charge transfer caused by approaching or directly contacting each other of objects with different electro-static charge potentials, simply speaking, it is a phenomenon that a process of charge transfer is formed since an electro-static charge moves from one object to another instantaneously, that is, electro-static charge transfer between objects or surfaces with different electro-static potentials (potential differences). A Gate Driver on Array (GOA) technology refers to a technology of disposing a GOA unit configured to drive a gate line in a non-display area.

With development of display technologies, "screen ratio" has become a relatively important performance parameter of display products. According to consumers' pursuit of a portability and a viewing angle effect and the like of the display products, a high resolution, a narrow bezel, and an even full-screen display become a new trend of development of the display products, so narrowing of a bezel has been paid more and more attention in a design of the display products.

FIG. 1A is a schematic diagram of a structure of a display substrate. As shown in FIG. 1A, the display substrate may include a display area (also may be called an Active Area (AA)) 100 and a non-display area 200 located around the display area 100. Here, an illustration is made in FIG. 1A by taking a case in which both a contour of the display area 100 and a contour of the non-display area are a rectangular shape with inverted rounded corners as an example.

In an exemplary embodiment, as shown in FIG. 1A, the display area 100 may include: a first edge (also may be called a left edge) and a second edge (also may be called a right edge) which are oppositely disposed in the first direction X, and a third edge (also may be called an upper edge) and a fourth edge (also may be called a lower edge) which are oppositely disposed in the second direction Y, wherein adjacent edges are connected by an arced chamfer, forming a quadrilateral shape with inverted rounded corners. For example, the first edge and second edge may be parallel to the second direction Y, the third edge and the fourth edge may be parallel to the first direction X, the first direction X may be an extending direction of a grid line in the display area, the second direction Y may be an extending direction of a data line in the display area, and the first direction X and the second direction Y may be perpendicular to each other.

In an exemplary embodiment, the contour of the non-display area 200 may be a rectangular shape with inverted rounded corners. For example, as shown in FIG. 1A, the non-display area 200 may include: a first bezel area (also may be called a lower bezel area) 201 and a second bezel area (also may be called an upper bezel area) 202 oppositely disposed in the second direction Y, and a third bezel area (also may be called a left bezel area) 203 and a fourth bezel area (also may be called a right bezel area) 204 oppositely disposed in the first direction X. The non-display area 200 may further include: a first corner area 211 connecting the first bezel area 201 and the third bezel area 203, a second corner area 212 connecting the first bezel area 201 and the fourth bezel area 204, a third corner area 213 connecting the second bezel area 202 and the third bezel area 203, and a fourth corner area 214 connecting the second bezel area 202 and the fourth bezel area 204.

Figure 1B:
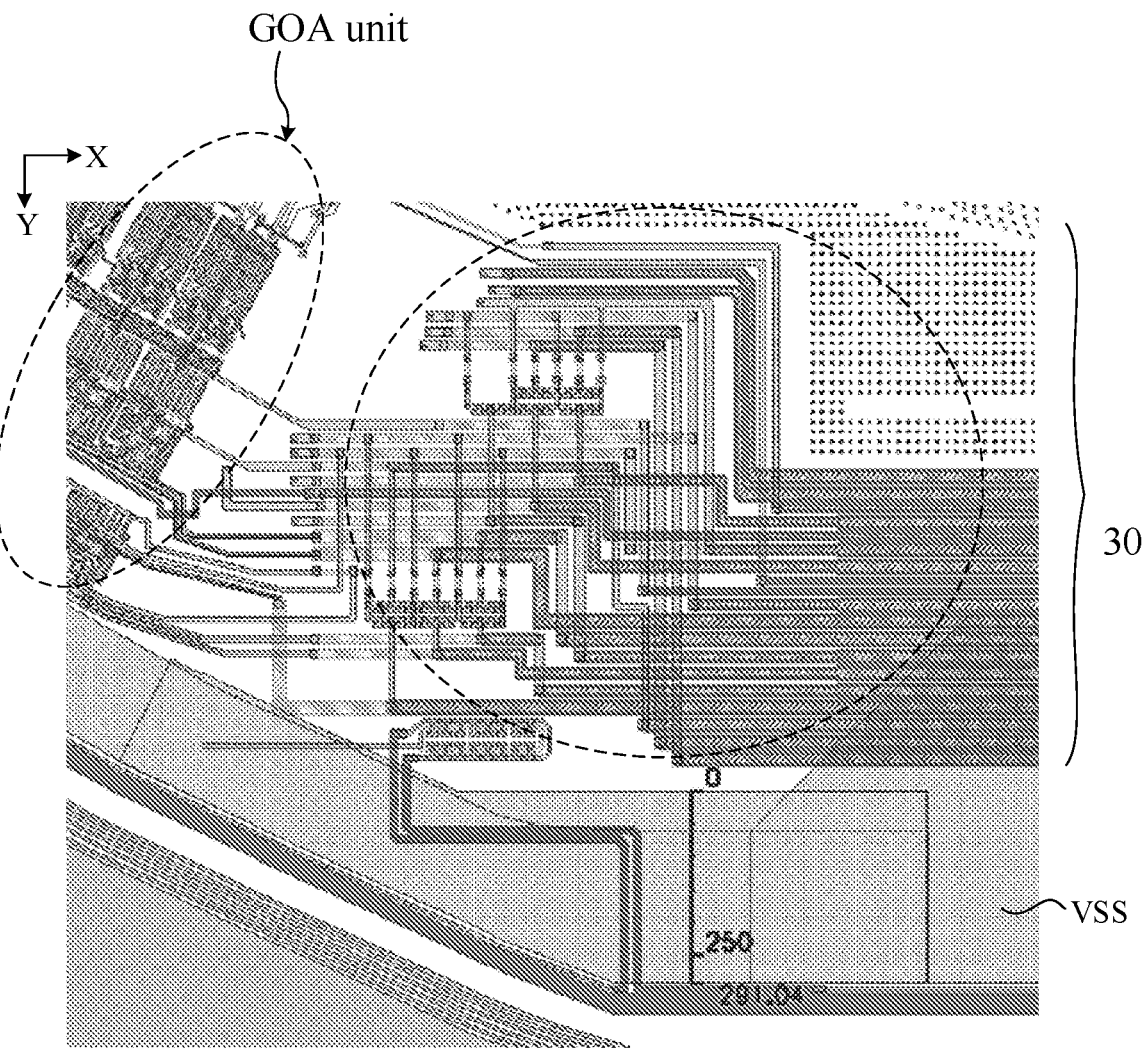
FIG. 1B is a schematic diagram of an arrangement of a first corner area in the display substrate shown in FIG. 1A.
Figure 1C:
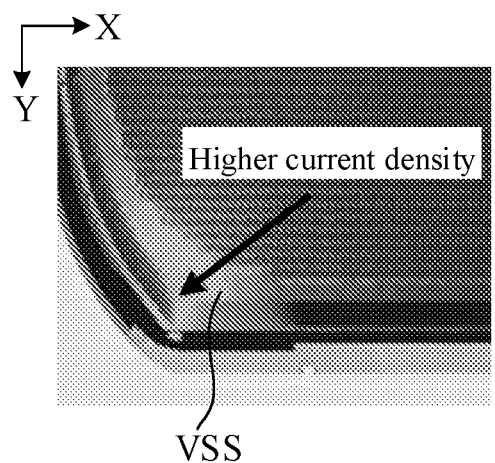
FIG. 1C is a simulated current density diagram of a first corner area in the display substrate shown in FIG. 1A.

FIG. 1B is a schematic diagram of an arrangement of a first corner area in the display substrate shown in FIG. 1A, and FIG. 1C is a simulated current density diagram of a first corner area in the display substrate shown in FIG. 1A. Herein, illustrations are made in FIG. 1B and FIG. 1C by taking a first corner area 211 of one inverted rounded corner in the non-display area as an example. In FIG. 1C, a trace portion of a first power supply line VSS where a current density is higher is represented by an area indicated by an arrow.

In an exemplary embodiment, as shown in FIGS. 1B and 1C, a signal provided by an internal circuit unit of a display apparatus (such as a mobile phone, etc.) from an end (Pad end) of the display substrate connected to an external circuit to a GOA unit needs to be transferred through a Bending area, a length of a metal trace of a lead wire starting from the Bending area till accessing to the GOA unit is relatively long, easily causing electro-static charge accumulation in a corner area. Therefore, an Electro-Static discharge (ESD) protection unit may be disposed in an arc-shaped corner area to prevent ESD damage. However, in some technologies, a layout of the ESD protection unit is unreasonable, and a wiring space is wasted, so that the ESD protection unit occupies a lower part of the wiring space to a certain extent. For example, the ESD protection unit will encroach on a wiring space of a trace of the first power supply line VSS to a certain extent, resulting in a higher current density of the first power supply line VSS, increasing risk of burning the first power supply line VSS, and reducing uniformity and yield of the display product.

An embodiment of the present disclosure provides a display substrate. The display substrate may include: a display area and a non-display area located around the display area, wherein the non-display area may include: at least one ESD protection unit, each ESD protection unit may include: multiple transistors connected in series, a first electrode of each transistor is connected with a gate, and the multiple transistors are arranged along a first inclination direction DR1. A first preset included angle is provided between the first inclination direction DR1 and a first direction X, wherein the first preset included angle may be about 10° to 80°, and the first direction X is an extending direction of a gate line in the display area.

Thus, an arrangement direction of multiple transistors connected in series in the ESD protection unit is set to form a first preset angle with the first direction X, which can reduce wiring space occupied by the ESD protection unit in the first direction X and a second direction Y perpendicular to the first direction X, compared to the arrangement direction of the multiple transistors connected in series set in parallel to the first direction X. Therefore, reducing wiring space of the ESD protection unit can be achieved, occupying wiring space of other traces can be avoided, and improving uniformity and yield of the product can be achieved. In addition, the ESD protection unit is achieved by adopting a transistor structure, so that when other transistors in the display substrate are manufactured, the ESD protection unit may be manufactured at the same time without adding an additional manufacturing process.

In an exemplary embodiment, multiple transistors are arranged along a first inclination direction DR1, which may include: the multiple transistors are disposed sequentially along the first inclination direction DR1 and disposed flush in a second inclination direction DR2, wherein the second inclination direction DR2 may be perpendicular to the first inclination direction DR1. For example, the multiple transistors are disposed sequentially along the first inclination direction DR1, which may refer to that: active layers of the multiple transistors are disposed sequentially along the first inclination direction DR1, gates of the multiple transistors are disposed sequentially along the first inclination direction DR1, first electrodes of the multiple transistors are disposed sequentially along the first inclination direction DR1, and second electrodes of the multiple transistors are disposed sequentially along the first inclination direction DR1.

In an exemplary embodiment, multiple transistors are arranged along a first inclination direction DR1, which may include: an active layer of each transistor extends along the first inclination direction DR1, and a first electrode, a second electrode, and a gate of each transistor each extend along a second inclination direction DR2, wherein the second inclination direction DR2 is perpendicular to the first inclination direction DR1.

In an exemplary embodiment, in each ESD protection unit, active layers of multiple transistors may be an integral structure connected to each other.

In an exemplary embodiment, active layers of multiple transistors in multiple ESD protection units may be an integral structure connected to each other. For example, active layers of transistors in two ESD protection units or three ESD protection units disposed sequentially along the first inclination direction DR1 may be an integral structure connected to each other.

In an exemplary embodiment, the ESD protection unit may further include: a first voltage signal line VGH, a second voltage signal line VGL, and an electro-static discharge protection line Signal, wherein the first voltage signal line VGH is connected with one transistor located at one end of the ESD protection unit, the second voltage signal line VGL is connected with another transistor located at another end of the ESD protection unit, and the electro-static discharge protection line Signal is connected with any one connection node located between the one transistor and the another transistor. Herein, the connection node may refer to a node formed between two adjacent transistors connected in series. For example, taking the ESD protection unit including four transistors connected in series as an example, the one transistor located at one end of the ESD protection unit may refer to a first transistor, the another transistor located at another end of the ESD protection unit may refer to a fourth transistor, and any one connection node located between the one transistor and the another transistor may include: a first connection node formed by the first transistor connected in series with a second transistor, a second connection node formed by a second transistor connected in series with a third transistor, or a third connection node formed by a third transistor connected in series with the fourth transistor. For example, the electro-static discharge protection line Signal is connected with the second connection node formed by the second transistor connected in series with the third transistor.

Here, the electro-static discharge protection line Signal refers to a trace on the display substrate that is easy to accumulate electro-static charges, and the ESD protection unit is configured to release the electro-static charges accumulated on the electro-static discharge protection line Signal. For example, the electro-static charges may be positive or negative.

In an exemplary embodiment, taking the ESD protection unit being connected with a GOA unit as an example, the electro-static discharge protection line Signal may include, but is not limited to: at least part of signal lines such as a first clock signal line ESTV, a second clock signal line ECB, a third clock signal line ECK, a fourth clock signal line GSTV, a fifth clock signal line GCB, a sixth clock signal line GCK, a seventh clock signal line RSTV, an eighth clock signal line RCB, or a ninth clock signal line RCK, etc. Of course, the electro-static discharge protection line Signal may also be another signal line which needs to be anti-static and here, no limitation is made thereto in the embodiments of the present disclosure.

In an exemplary embodiment, each electro-static discharge protection line Signal may be connected to one ESD protection unit to achieve anti-static.

In an exemplary embodiment, a signal of the first voltage signal line VGH is a high level signal, and a signal of the second voltage signal line VGL is a low level signal.

In an exemplary embodiment, for each ESD protection unit, multiple transistors connected in series may include, but are not limited to: two transistors connected in series, three transistors connected in series, four transistors connected in series, five transistors connected in series, or six transistors connected in series, or other structures. Herein, a quantity of transistors in the ESD protection unit may be set according to an actual application scenario, and here, no limitation is made thereto in the embodiments of the present disclosure.

In an exemplary embodiment, the non-display area may include: a first bezel area and a second bezel area oppositely disposed in a second direction, a third bezel area and a fourth bezel area oppositely disposed in a first direction, a first corner area connecting the first bezel area and the third bezel area, a second corner area connecting the first bezel area and the fourth bezel area, a third corner area connecting the second bezel area and the third bezel area, and a fourth corner area connecting the second bezel area and the fourth bezel area, wherein at least one of the first corner area to the fourth corner area is an arc-shaped corner area, the ESD protection unit is located in the arc-shaped corner area, the first direction may be an extending direction of a gate line in the display area, and the second direction may be an extending direction of a data line in the display area.

In an exemplary embodiment, the non-display area of the display substrate may include, but is not limited to: a gate drive circuit (Gate GOA unit), an emitting control drive circuit (EM GOA unit), an electro-static discharge protection unit (ESD circuit), and a trace (e.g., a first power supply line VSS). Of course, the non-display area may also include: another circuit, such as a source drive circuit for providing a data voltage to a data line, or a detection circuit (CT) for performance detection, etc., and here, no limitation is made thereto in the embodiments of the present disclosure.

In an exemplary embodiment, the non-display area may also include: a first power supply line VSS, and part of a trace of the first power supply line VSS located in the arc-shaped corner area includes: a first sub-trace portion extending along the first inclination direction and a second sub-trace portion extending along the first direction. For example, a width of the second sub-trace portion may be 300 microns to 343 microns, for example, the width of the second sub-trace portion may be 323.49 microns. For example, a width of the first sub-trace portion may be 250 microns to 270 microns, and the width of the first sub-trace portion may be 260 microns. Herein, a width refers to a dimension characteristic along the second direction Y. Here, the exemplary embodiments of the present disclosure are not limited thereto.

Thus, by reasonably setting a wiring space occupied by the ESD protection unit, encroaching on a VSS wiring space by the ESD protection unit can be avoided, so that a line width of the first power supply line VSS may be increased, and current of the first power supply line VSS can be reduced, and risk of burning the first power supply line VSS can be reduced.

For example, the first power supply line VSS is configured to provide a low voltage signal to the display substrate.

In an exemplary embodiment, the non-display area may also include: a gate drive GOA unit, wherein the gate drive GOA unit is connected with a gate line in the display area and connected with an electro-static discharge protection line in the ESD protection unit. Thus, by disposing the ESD protection unit obliquely along the first inclination direction DR1, wiring space occupied by the ESD protection unit can be reduced, and wiring space occupied by a connection line between the GOA unit and the ESD protection unit can be saved. Therefore, uniformity and yield of a product can be effectively improved. In addition, since the GOA unit is connected with an electro-static discharge protection line in a corresponding ESD protection unit, while the ESD protection unit is configured to release electro-static charges accumulated on the electro-static discharge protection line Signal, the ESD protection unit can protect the GOA unit from ESD damage.

In an exemplary embodiment, the display substrate may be an array substrate.

In an exemplary embodiment, the display substrate may be an Organic Light Emitting Diode (OLED) display substrate, or a Liquid Crystal Display (LCD) display substrate, etc. Here, no limitation is made thereto in the embodiments of the present disclosure.

The display substrate in an exemplary embodiment of the present disclosure will be described below with reference to the accompanying drawings, by taking a case in which both the contour of the display area and the contour of the non-display area in the display substrate are a rectangular shape with inverted rounded corners as an example.

Figure 2:
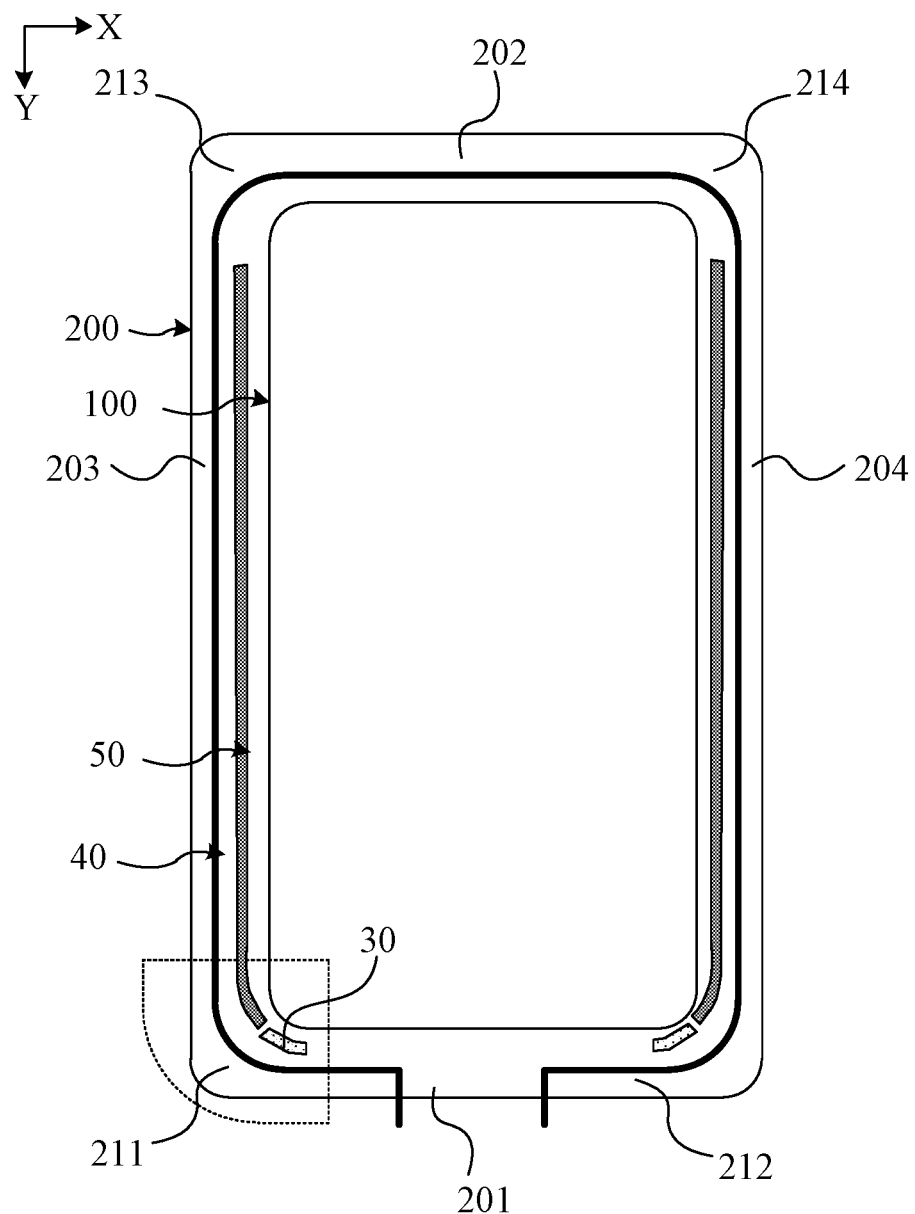
FIG. 2 is a schematic diagram of a structure of a display substrate in an exemplary embodiment of the present disclosure.

FIG. 2 is a schematic diagram of a structure of a display substrate in an exemplary embodiment of the present disclosure. As shown in FIG. 2, the display substrate may include: a display area 100 and a non-display area 200 located around the display area 100. The non-display area 200 may include: a first bezel area 201 and a second bezel area 202 oppositely disposed in the second direction Y, and a third bezel area 203 and a fourth bezel area 204 oppositely disposed in the first direction X. The non-display area 200 may further include: a first corner area 211 connecting the first bezel area 201 and the third bezel area 203, a second corner area 212 connecting the first bezel area 201 and the fourth bezel area 204, a third corner area 213 connecting the second bezel area 202 and the third bezel area 203, and a fourth corner area 214 connecting the second bezel area 202 and the fourth bezel area 204, wherein the first direction X is an extending direction of the grid line in the display area 100, and the second direction Y is an extending direction of the data line in the display area 100. For example, the first corner area 211 to the fourth corner area 214 are corner areas with inverted rounded corner. For example, the first corner area 211 may include: at least one ESD protection unit 30, and the second corner area 212 may include: at least one ESD protection unit 30.

In an exemplary embodiment, as shown in FIG. 2, the non-display area 200 may also include: GOA units 50 located at two sides of the display area 100 in the first direction X, wherein a GOA unit 50 is connected with a gate line in the display area 100, and the GOA unit 50 is connected with an electro-static discharge protection line in a corresponding ESD protection unit 30. Thus, since the GOA units 50 are disposed and arranged along an outer contour of the display area 100, by disposing the ESD protection units obliquely along the first inclination direction DR1, wiring space occupied by the ESD protection units can be reduced, and wiring space occupied by a connection line between the GOA unit and the ESD protection unit can be saved. Therefore, uniformity and yield of a product can be effectively improved. In addition, since the GOA unit 50 is connected with an electro-static discharge protection line in a corresponding ESD protection unit 30, while the ESD protection unit 30 is configured to release electro-static charges accumulated on the electro-static discharge protection line Signal, the ESD protection unit 30 can protect the GOA unit from ESD damage.

In an exemplary embodiment, the GOA unit 50 may include: multiple cascaded gate shift register units, wherein each gate shift register unit is connected to at least one gate line of the display area of the display substrate, and is configured to provide a gate drive signal of line-by-line shifting to at least one gate line of the display area. Or, the GOA unit 50 may include: multiple cascaded emitting control shift register units, wherein each emitting control shift register unit is connected to at least one gate line in the display area of the display substrate, and is configured to provide an emitting control signal of line-by-line shifting to at least one gate line of the display area, i.e., a gate drive circuit for outputting the emitting control signals. In some possible implementations, implementation forms of shift register units are various, and here, no limitation is made thereto in the embodiments of the present disclosure.

In an exemplary embodiment, as shown in FIG. 2, by taking the GOA unit 50 including multiple cascaded gate shift register units as an example, the multiple cascaded gate shift register units may be disposed along the outer contour of the display area 100, and an extending direction of a clock signal line of the gate shift register unit of a last stage may be set to be the same as or approximately the same as the first inclination direction DR1. Thus, by setting the extending direction of the clock signal line of the gate shift register unit of the last stage in the GOA unit 50 to be the same as the first inclination direction DR1, wiring space occupied by the gate shift register unit of the last stage in the GOA unit 50 in the first direction X and the second direction Y perpendicular to the first direction X can be reduced, so that wiring space of the GOA unit can be reduced, wiring space occupied by the connection line between the GOA unit and the ESD protection unit can be saved, encroaching on another wiring space can be avoided, and uniformity and yield of a product can be effectively improved.

For example, by taking the clock signal line of the gate shift register unit of the last stage being a broken line as an example, "the extending direction of the clock signal line of the gate shift register unit of the last stage is the same as the first inclination direction DR1" may refer to: an extending direction of a main body portion of the clock signal line is the same as the first inclination direction DR1. Or, by taking the clock signal line of the gate shift register unit of the last stage being a curve as an example, "the extending direction of the clock signal line of the gate shift register unit of the last stage is the same as the first inclination direction DR1" may refer to: a tangential direction of the clock signal line is the same as the first inclination direction DR1. Here, no limitation is made thereto in the embodiments of the present disclosure.

For example, the clock signal line of the gate shift register unit of the last stage may include: at least one of signal lines such as a first clock signal line ESTV, a second clock signal line ECB, a third clock signal line ECK, a fourth clock signal line GSTV, a fifth clock signal line GCB, a sixth clock signal line GCK, a seventh clock signal line RSTV, an eighth clock signal line RCB, or a ninth clock signal line RCK, etc. Here, no limitation is made thereto in the embodiments of the present disclosure.

In an exemplary embodiment, as shown in FIG. 2, the non-display area 200 may also include: a trace 40 disposed at one side of the GOA unit 50 and the ESD protection unit 30 away from the display area 100, for example, the trace 40 may be the first power supply line VSS. Thus, by reasonably setting a wiring space occupied by the ESD protection unit, encroaching on a wiring space of the first power supply line VSS by the ESD protection unit can be avoided, so that a line width of the first power supply line VSS can be increased, a current of the first power supply line VSS can be reduced, and risk of burning the first power supply line VSS can be reduced.

Figure 3A:
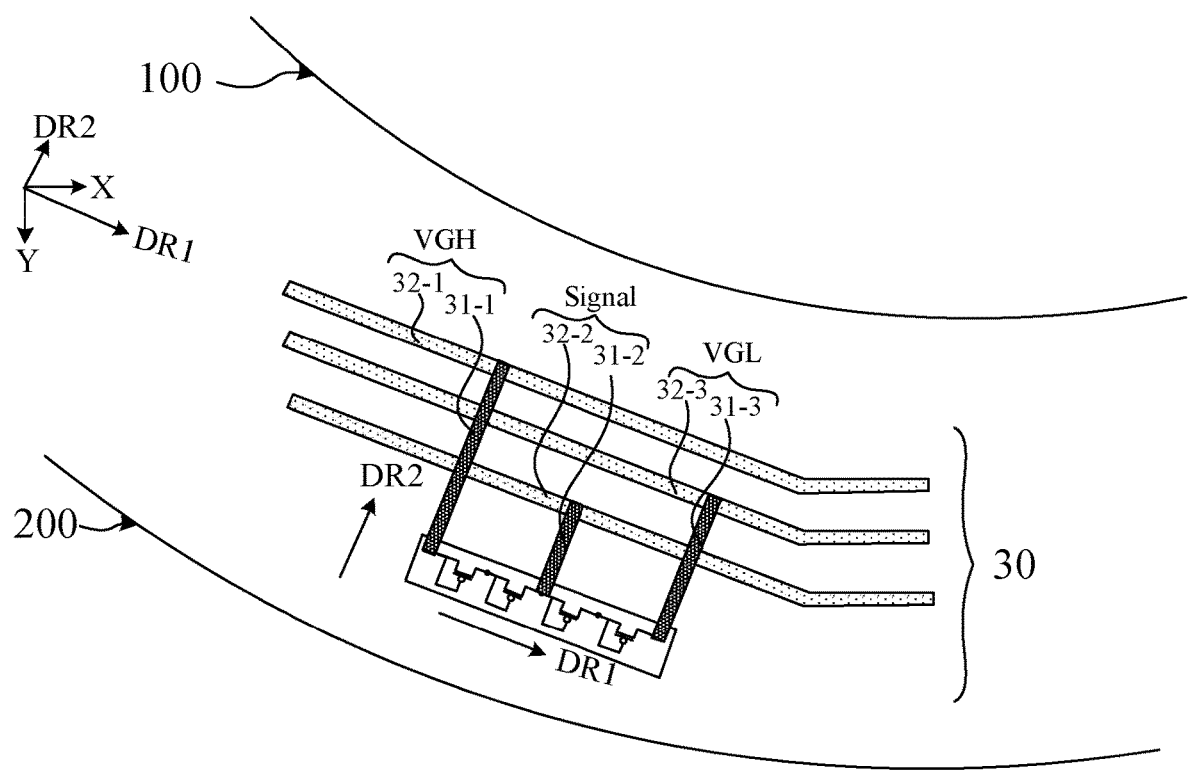
FIG. 3A is a schematic diagram of a first arrangement of an ESD protection unit in an exemplary embodiment of the present disclosure.
Figure 3B:
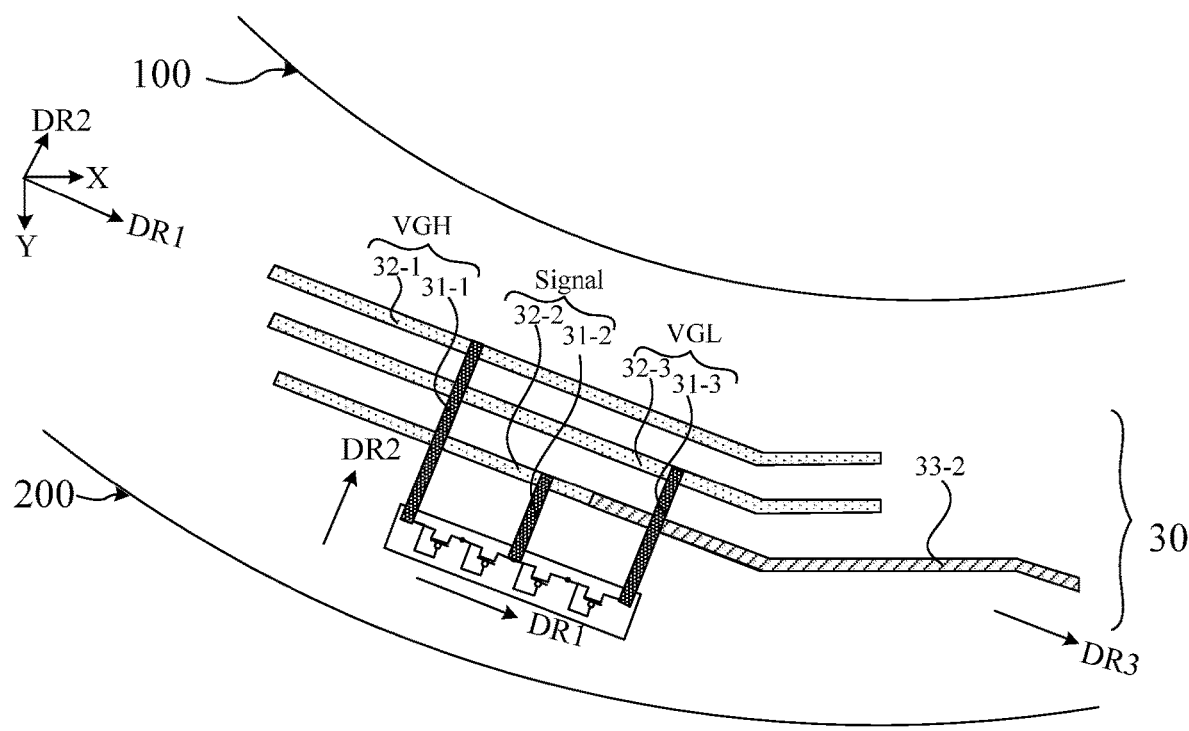
FIG. 3B is a schematic diagram of a second arrangement of an ESD protection unit in an exemplary embodiment of the present disclosure.

FIG. 3A is a schematic diagram of a first arrangement of an ESD protection unit in an exemplary embodiment of the present disclosure, and FIG. 3B is a schematic diagram of a second arrangement of an ESD protection unit in an exemplary embodiment of the present disclosure. Here, traces in FIG. 3A to FIG. 3B are only an exemplary description, a quantity of traces does not represent an actual quantity, and a shape of the trace does not represent an actual shape. Herein, in FIG. 3A and FIG. 3B, illustrations are made by taking one ESD protection unit including four transistors connected in series, an electro-static discharge protection line Signal, a first voltage signal line VGH, and a second voltage signal line VGL in the display substrate as an example. An illustration is made in FIG. 3A by taking a case in which the first voltage signal line VGH, the second voltage signal line VGL, and the electro-static discharge protection line Signal each include a first trace and a second trace as an example. An illustration is made in FIG. 3B by taking a case in which the first voltage signal line VGH and the second voltage signal line VGL each include a first trace and a second trace, and the electro-static discharge protection line Signal includes a first trace, a second trace, and a third trace as an example.

In an exemplary embodiment, as shown in FIGS. 3A and 3B, the ESD protection unit 30 may include: a first voltage signal line VGH, a second voltage signal line VGL, an electro-static discharge protection line Signal, and four transistors connected in series. Herein a first electrode of each transistor is connected with a gate, the first voltage signal line VGH is connected with a first transistor at one end of the ESD protection unit, the second voltage signal line VGL is connected with a fourth transistor at another end of the ESD protection unit, and the electro-static discharge protection line Signal is connected with a connection node formed between a second transistor and a third transistor.

In an exemplary embodiment, as shown in FIGS. 3A and 3B, the first electrode of each transistor is connected with the gate, and the four transistors are arranged along a first inclination direction DR1, wherein a first preset included angle is provided between the first inclination direction DR1 and a first direction X, the first preset included angle may be about 10° to 80°, and the first direction X is an extending direction of a gate line in the display area. Thus, by disposing the four transistors in the ESD protection unit 30 obliquely along the first inclination direction DR1, wiring space occupied by the ESD protection unit in the first direction X and a second direction Y can be reduced, compared to disposing the ESD protection unit 30 horizontally along the first direction X. Therefore, reducing wiring space of the ESD protection unit can be achieved, occupying wiring space of other traces can be avoided, and improving uniformity and yield of a display product can be achieved. Here, a degree of the first preset included angle is related to a shape of an outer contour of a corner area of the display area (AA area), so the first preset included angle may be set according to a radian of an inverted rounded corner of an outer contour of the display area (AA area), as long as reducing wiring space of the ESD protection unit can be achieved and occupying wiring space of other traces can be avoided. No limitation is made thereto in the embodiments of the present disclosure.

In an exemplary embodiment, at least one of the electro-static discharge protection line Signal, the first voltage signal line VGH, and the second voltage signal line VGL may include: a first trace and a second trace, wherein the first trace is disposed on the same layer as the first electrode and a second electrode of the transistor, and the second trace is disposed on the same layer as the gate of the transistor. For example, the first trace extends along a second inclination direction DR2, and the second trace extends along the first inclination direction DR1, wherein the second inclination direction DR2 is perpendicular to the first inclination direction DR1.

In an exemplary embodiment, as shown in FIGS. 3A and 3B, the first voltage signal line VGH may include: a first connection line 31-1 and a first extension line 32-1. For example, the first connection line 31-1, as the first trace in the first voltage signal line VGH, may be a straight line extending along the second inclination direction DR2. For example, the first extension line 32-1, as the second trace in the first voltage signal line VGH, may be a straight line or a broken line extending along the first inclination direction DR1, and the second inclination direction DR2 is perpendicular to the first inclination direction DR1. Herein, illustrations are made in FIGS. 3A and 3B by taking the first extension line 32-1 being the broken line as an example. For example, as shown in FIGS. 3A and 3B, a main body portion of the first extension line 32-1 may extend along the first inclination direction DR1, and an extension portion of the first extension line 32-1 may extend along the first direction X. Or, a main body portion of the first extension line 32-1 may extend along the first inclination direction DR1, and an extension portion of the first extension line 32-1 may extend along the second direction Y. Here, no limitation is made thereto in the embodiments of the present disclosure.

In an exemplary embodiment, as shown in FIG. 3A, the electro-static discharge protection line Signal may include: a second connection line 31-2 and a second extension line 32-2. For example, the second connection line 31-2, as the first trace in the electro-static discharge protection line Signal, may be a straight line extending along the second inclination direction DR2. For example, the second extension line 32-2, as the second trace in the electro-static discharge protection line Signal, may be a straight line or a broken line extending along the first inclination direction DR1, and the second inclination direction DR2 is perpendicular to the first inclination direction DR1. Herein, an illustration is made in FIG. 3A by taking the second extension line 32-2 being the broken line as an example. For example, as shown in FIG. 3A, a main body portion of the second extension line 32-2 may extend along the first inclination direction DR1, and an extension portion of the second extension line 32-2 may extend along the first direction X. Or, a main body portion of the second extension line 32-2 may extend along the first inclination direction DR1, and an extension portion of the second extension line 32-2 may extend along the second direction Y. Here, no limitation is made thereto in the embodiments of the present disclosure.

In an exemplary embodiment, as shown in FIGS. 3A and 3B, the second voltage signal line VGL may include: a third connection line 31-3 and a third extension line 32-3. For example, the third connection line 31-3, as the first trace in the second voltage signal line VGL, may be a straight line extending along the second inclination direction DR2. For example, the third extension line 32-3, as the second trace in the second voltage signal line VGL, may be a straight line or a broken line extending along the first inclination direction DR1, and the second inclination direction DR2 is perpendicular to the first inclination direction DR1. Herein, an illustration is made in FIG. 3 by taking the third extension line 32-3 being the broken line as an example. For example, a main body portion of the third extension line 32-3 may extend along the first inclination direction DR1, and an extended portion of the third extension line 32-3 may extend along the first direction X. Or, a main body portion of the third extension line 32-3 may extend along the first inclination direction DR1, and an extension portion of the third extension line 32-3 may extend along the second direction Y. Here, no limitation is made thereto in the embodiments of the present disclosure.

In an exemplary embodiment, at least one of the electro-static discharge protection line Signal, the first voltage signal line VGH, and the second voltage signal line VGL may also include: a third trace, wherein a film layer on which the third trace is located is located between a film layer on which the first trace is located and a film layer on which the second trace is located.

In an exemplary embodiment, the third trace may include: at least one of a straight line and a broken line, wherein the straight line extends along the first inclination direction DR1, and the broken line may at least include a trace portion extending along the first inclination direction DR1.

In an exemplary embodiment, the broken line may include at least one of the following: a first broken line, a second broken line, and a third broken line. For example, the first broken line may include: a first sub-line extending along the first inclination direction DR1 and a second sub-line extending along the first direction X, wherein the first sub-line and the second sub-line are connected sequentially. For example, the second broken line may include: a third sub-line extending along the first inclination direction DR1, a fourth sub-line extending along the first direction X, and a fifth sub-line extending along a third inclination direction DR3, wherein the third sub-line, the fourth sub-line and the fifth sub-line are connected sequentially, wherein a second preset included angle is provided between the third inclination direction and the first direction X. For example, the second preset included angle may be different from the first preset included angle. For example, the third broken line may include: a sixth sub-line extending along the first inclination direction DR1 and a seventh sub-line extending along the second direction Y, wherein the sixth sub-line and the seventh sub-line are connected sequentially, wherein the second direction Y is the extending direction of the data line in the display area. Of course, other broken lines may also be used, and here, no limitation is made thereto in the embodiments of the present disclosure. Furthermore, a degree of the second preset included angle is related to a shape of an outer contour of a corner area of the display area (AA area), so the second preset included angle may be set according to a radian of an inverted rounded corner of an outer contour of the display area (AA area), as long as reducing wiring space of the ESD protection unit can be achieved and occupying wiring space of other traces can be avoided. No limitation is made thereto in the embodiments of the present disclosure.

In an exemplary embodiment, as shown in FIG. 3B, the electro-static discharge protection line Signal may include: the second connection line 31-2, the second extension line 32-2, and a second lead line 33-2. For example, the second connection line 31-2, as the first trace in the electro-static discharge protection line Signal, may be a straight line extending along the second inclination direction DR2. For example, the second extension line 32-2, as the second trace in the electro-static discharge protection line Signal, may be a straight line or a broken line extending along the first inclination direction DR1, and the second inclination direction DR2 is perpendicular to the first inclination direction DR1. For example, the second lead line 33-2, as the third trace in the electro-static discharge protection line Signal, may be a straight line or a broken line extending along the first inclination direction DR1, and the second inclination direction DR2 is perpendicular to the first inclination direction DR1. For example, the second lead line 33-2, as the third trace in the electro-static discharge protection line Signal, may be at least one of a first broken line, a second broken line, and a third broken line. For example, as shown in FIG. 3B, taking the second lead line 33-2 being the second broken line as an example, the second lead line 33-2 may include a third sub-line extending along the first inclination direction DR1, a fourth sub-line extending along the first direction X, and a fifth sub-line extending along the third inclination direction DR3, wherein the third sub-line, the fourth sub-line, and the fifth sub-line are connected sequentially, and the second preset included angle is provided between the third inclination direction DR3 and the first direction X. For example, the second preset included angle may be different from the first preset included angle. Herein, an illustration is made in FIG. 3B by taking the second extension line 32-2 being the straight line and the second lead line 33-2 being the second broken line as an example. Here, no limitation is made thereto in the embodiments of the present disclosure.

Of course, linear shapes of the three, i.e., the electro-static discharge protection line Signal, the first voltage signal line VGH, and the second voltage signal line VGL may be other embodiments in which the ESD protection units may be arranged along the first inclination direction DR1, in addition to the exemplary embodiments listed above. Here, no limitation is made thereto in the embodiments of the present disclosure.

Figure 4:
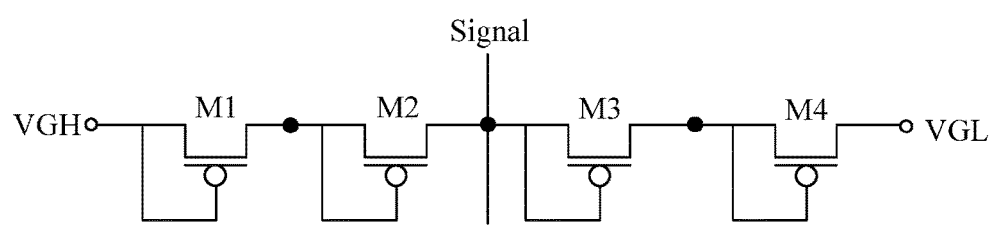
FIG. 4 is a schematic diagram of an equivalent circuit of an ESD protection unit in an exemplary embodiment of the present disclosure.

FIG. 4 is a schematic diagram of an equivalent circuit of an ESD protection unit in an exemplary embodiment of the present disclosure. As shown in FIG. 4, the ESD protection unit may include: four transistors (a first transistor M1 to a fourth transistor M4) connected in series and three signal lines (the first voltage signal line VGH, the second voltage signal line VGL, and the electro-static discharge protection line Signal).

In an exemplary embodiment, as shown in FIG. 4, a first electrode of the first transistor M1 and a gate of the first transistor M1 are connected with the first voltage signal line VGH, a second electrode of the first transistor M1 is connected with a first electrode of the second transistor M2 and a gate of the second transistor M2, a second electrode of the second transistor M2, a first electrode of the third transistor M3, and a gate of the third transistor M3 are connected with the electro-static discharge protection signal line Signal, a second electrode of the third transistor M3 is connected with a first electrode of the fourth transistor M4 and a gate of the fourth transistor M4, and a second electrode of the fourth transistor M4 is connected with the second voltage signal line VGL. Thus, the Electro-Static discharge (ESD) protection unit may discharge electro-static charges accumulated by the electro-static discharge protection line Signal.

In an exemplary embodiment, a working principle of the electro-static discharge protection unit shown in FIG. 4 is that when positive charges gathered by the electro-static discharge protection line Signal meet a first condition, the electro-static discharge protection line Signal will output a high voltage signal, so that the first transistor M1 and the second transistor M2 are turned on, causing the high voltage signal to be pulled down by the first voltage signal line VGH, thereby achieving elimination of static electricity. When negative charges gathered by the electro-static discharge protection line Signal meet a second condition, the electro-static discharge protection line Signal will output a low voltage signal, so that the third transistor M3 and the fourth transistor M4 are turned on, causing the low voltage signal to be pulled high by the second voltage signal line VGL, thereby achieving elimination of static electricity. Herein, the first condition may refer to a minimum positive charge amount capable of causing the ESD protection unit to burn, and the second condition may refer to a minimum negative charge amount capable of causing the ESD protection unit to burn.

In an exemplary embodiment, the first transistor M1 to the fourth transistor M4 may be P-type transistors, or may be N-type transistors. Here, no limitation is made thereto in the embodiments of the present disclosure.

Exemplary description is made below through a process for preparing the ESD protection unit. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching. The present disclosure is not limited thereto. A "thin film" refers to a layer of thin film made of a material on a base substrate through a process such as deposition, coating, etc. If the "thin film" does not need a patterning process in an entire manufacturing process, the "thin film" may also be called a "layer". If the "thin film" needs a patterning process in an entire manufacturing process, it is called a "thin film" before the patterning process, and called a "layer" after the patterning process. The "layer" after the patterning process includes at least one "pattern". "A and B are arranged in a same layer" described in the present disclosure refers to that A and B are formed simultaneously through a same patterning process.

In an exemplary embodiment, in a direction perpendicular to the plane of the display substrate, the ESD protection unit 30 may include: a semiconductor layer, a first conductive layer, a second conductive layer, and a third conductive layer that are disposed sequentially on a base substrate, wherein the semiconductor layer may include: active layers of multiple transistors; the first conductive layer may include: gates of the multiple transistors and the second trace included in at least one of the electro-static discharge protection line Signal, the first voltage signal line VGH, and the second voltage signal line VGL; the second conductive layer may include: the third trace included in at least one of the electro-static discharge protection line Signal, the first voltage signal line VGH, and the second voltage signal line VGL; and the third conductive layer may include first electrodes of the multiple transistors, second electrodes of the multiple transistors, and the first trace included in at least one of the electro-static discharge protection line Signal, the first voltage signal line VGH, and the second voltage signal line VGL.

FIGS. 5A to 5D are schematic diagrams of a process for preparing the ESD protection unit in the display substrate shown in FIG. 2, illustrating layout structures of one ESD protection unit of the display substrate. With reference to the structure of the ESD protection unit shown in FIG. 3B, a process for preparing the ESD protection unit in the display substrate provided in the exemplary embodiment of the present disclosure will be described below in conjunction with FIGS. 5A to 5D.

In an exemplary embodiment, as shown in FIGS. 5A to 5D, the process for preparing the ESD protection unit may include the following operations.

(1) A pattern of a semiconductor layer is formed on a base substrate.

In an exemplary embodiment, a pattern of a semiconductor layer is formed on a base substrate, which may include: a first insulation thin film and a semiconductor thin film are deposited sequentially on the base substrate, and the semiconductor thin film is patterned through a patterning process to form a first insulation layer that covers the whole base substrate, and the semiconductor layer disposed on the first insulation layer.

In an exemplary embodiment, the first insulation layer may be called a Buffer layer, and the semiconductor layer may be called an Active (ACT) layer.

Figure 5A:
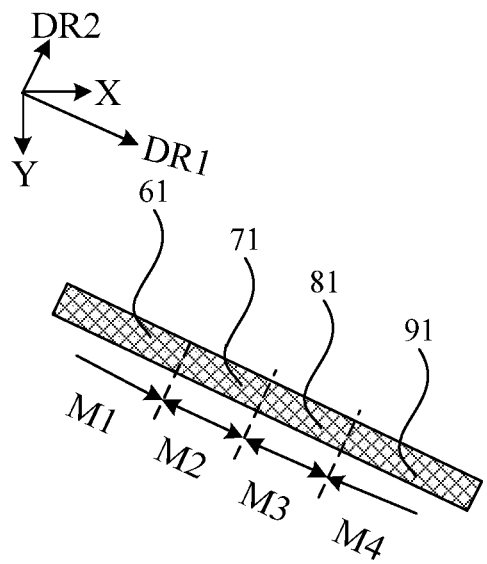
FIG. 5A is a schematic diagram of a structure after a semiconductor layer in an ESD protection unit is formed in an exemplary embodiment of the present disclosure.

In an exemplary embodiment, as shown in FIG. 5A, the semiconductor layer may include: a first active layer 61, a second active layer 71, a third active layer 81, and a fourth active layer 91 in each ESD protection unit, wherein the first active layer 61 serves as an active layer of the first transistor M1, the second active layer 71 serves as an active layer of the second transistor M2, the third active layer 81 serves as an active layer of the third transistor M3, and the fourth active layer 91 serves as an active layer of the fourth transistor M4.

In an exemplary embodiment, as shown in FIG. 5A, the first active layer 61, the second active layer 71, the third active layer 81, and the fourth active layer 91 are disposed sequentially along the first inclination direction DR1, and flush in the second inclination direction DR2. Thus, the ESD unit may be arranged obliquely along the first inclination direction DR1.

In an exemplary embodiment, as shown in FIG. 5A, shapes of the first active layer 61, the second active layer 71, the third active layer 81, and the fourth active layer 91 may be strip shapes extending along the first inclination direction DR1.

In an exemplary embodiment, as shown in FIG. 5A, the active layer 61 of the first transistor M1, the active layer 71 of the second transistor M2, and the active layer 81 of the third transistor M3 may be an integral structure connected to each other.

In an exemplary embodiment, the base substrate may be a flexible base substrate, or a rigid base substrate.

In an exemplary embodiment, the semiconductor layer may be made of a metal oxide material. For example, the metal oxide material may include, but is not limited to: an oxide containing indium and tin, an oxide containing tungsten and indium, an oxide containing tungsten and indium and zinc, an oxide containing titanium and indium, an oxide containing titanium and indium and tin, an oxide containing indium and zinc, an oxide containing silicon and indium and tin, or an oxide containing indium or gallium and zinc, etc. For example, the semiconductor layer may be made of a material such as amorphous indium gallium zinc oxide (a-IGZO) material, zinc oxynitride (ZnON), indium zinc tin oxide (IZTO), amorphous silicon (a-Si), polysilicon (p-Si), hexathiophene, or polythiophene, etc. For example, the semiconductor layer may be a single layer, a double layer, or a multi-layer, etc. Here, no limitation is made thereto in the embodiments of the present disclosure.

In an exemplary implementation, the first insulation layer may adopt any one or more of silicon oxide (SiOx), silicon nitride (SiNx), and silicon oxynitride (SiON), and may be a single layer, a multi-layer, or a composite layer.

(2) A pattern of a first conductive layer is formed.

Figure 5B:
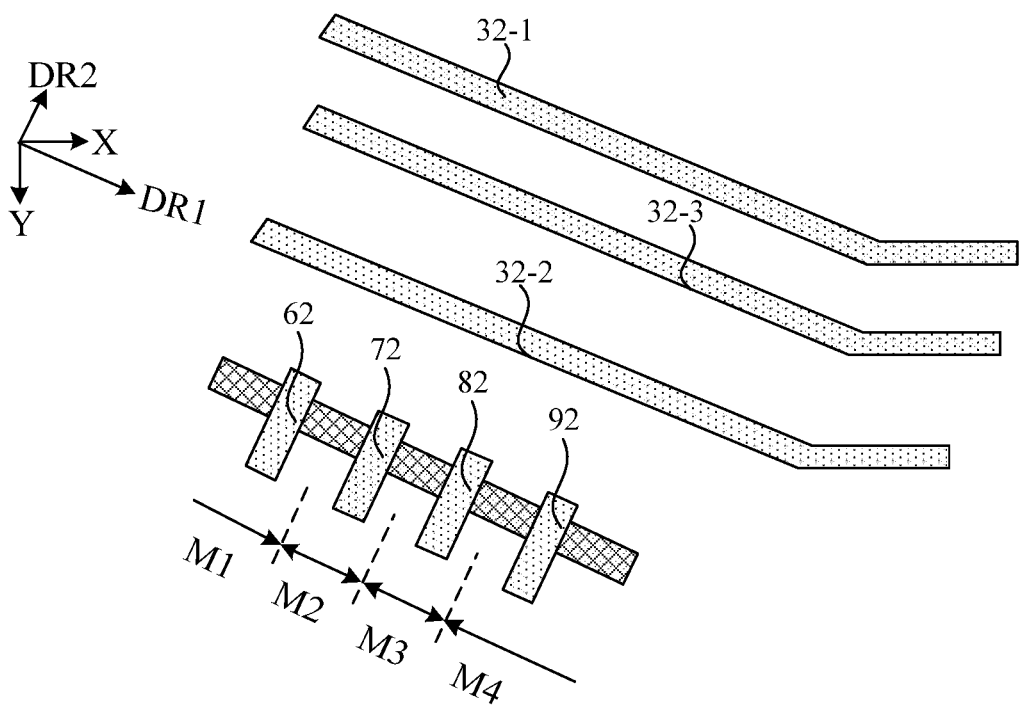
FIG. 5B is a schematic diagram of a structure after a first conductive layer in an ESD protection unit is formed in an exemplary embodiment of the present disclosure.

In an exemplary embodiment, as shown in FIG. 5B, a pattern of a first conductive layer is formed, which may include: a second insulation thin film and a first metal thin film are deposited sequentially on the base substrate on which the aforementioned pattern is formed, and the first metal thin film is patterned through a patterning process to form a second insulation layer covering the pattern of the semiconductor layer, and the first conductive layer disposed on the second insulation layer.

In an exemplary embodiment, the second insulation layer may be called a gate insulation (GI) layer, and the first conductive layer may be called a first gate metal (Gate1) layer.

In an exemplary embodiment, as shown in FIG. 5B, the first conductive layer may include: a first gate electrode 62, a second gate electrode 72, a third gate electrode 82, and a fourth gate electrode 92 of each ESD protection unit, and may also include: a first extension line 32-1, a second extension line 32-2, and a third extension line 32-3.

In an exemplary embodiment, the first gate electrode 62 serves as the gate of the first transistor M1, and an orthographic projection of the first gate electrode 62 on the base substrate and an orthographic projection of the first active layer 61 on the base substrate have an overlapping area. The second gate electrode 72 serves as the gate of the second transistor M2, and an orthographic projection of the second gate electrode 72 on the base substrate and an orthographic projection of the second active layer 71 on the base substrate have an overlapping area. The third gate electrode 82 serves as the gate of the third transistor M3, and an orthographic projection of the third gate electrode 82 on the base substrate and an orthographic projection of the first active layer 81 on the base substrate have an overlapping area. The fourth gate electrode 92 serves as the gate of the fourth transistor M4, and an orthographic projection of the fourth gate electrode 92 on the base substrate and an orthographic projection of the first active layer 91 on the base substrate have an overlapping area.

In an exemplary embodiment, as shown in FIG. 5B, the first gate electrode 62, the second gate electrode 72, the third gate electrode 82, and the fourth gate electrode 92 may be disposed and spaced sequentially along the first inclination direction DR1, and flush in the second inclination direction DR2.

In an exemplary embodiment, the first extension line 32-1 serves as the second trace in the first voltage signal line VGH, so as to be connected with the first trace in the first voltage signal line VGH which is subsequently formed, to form the first voltage signal line VGH. The second extension line 32-2 serves as the second trace in the electro-static discharge protection line Signal, so as to be connected with the first trace in the electro-static discharge protection line Signal which is formed subsequently, to form the electro-static discharge protection line Signal. The third extension line 32-3 serves as the second trace in the second voltage signal line VGL, so as to be connected with the first trace in the second voltage signal line VGL which is formed subsequently, to form the second voltage signal line VGL.

In an exemplary embodiment, the second insulation layer may adopt any one or more of silicon oxide (SiOx), silicon nitride (SiNx), and silicon oxynitride (SiON), and may be a single layer, a multi-layer, or a composite layer.

In an exemplary embodiment, the second conductive layer may be made of a metal material. For example, the metal material may include, but is not limited to: any one or more of silver (Ag), copper (Cu), aluminum (Al), and molybdenum (Mo), or an alloy material of the metals listed above, such as aluminum-neodymium alloy (AlNd) or molybdenum-niobium alloy (MoNb), etc. For example, the second conductive layer may be a single-layer structure, or a multi-layer composite structure such as Mo/Cu/Mo or the like.

(3) A pattern of a second conductive layer is formed.

Figure 5C:
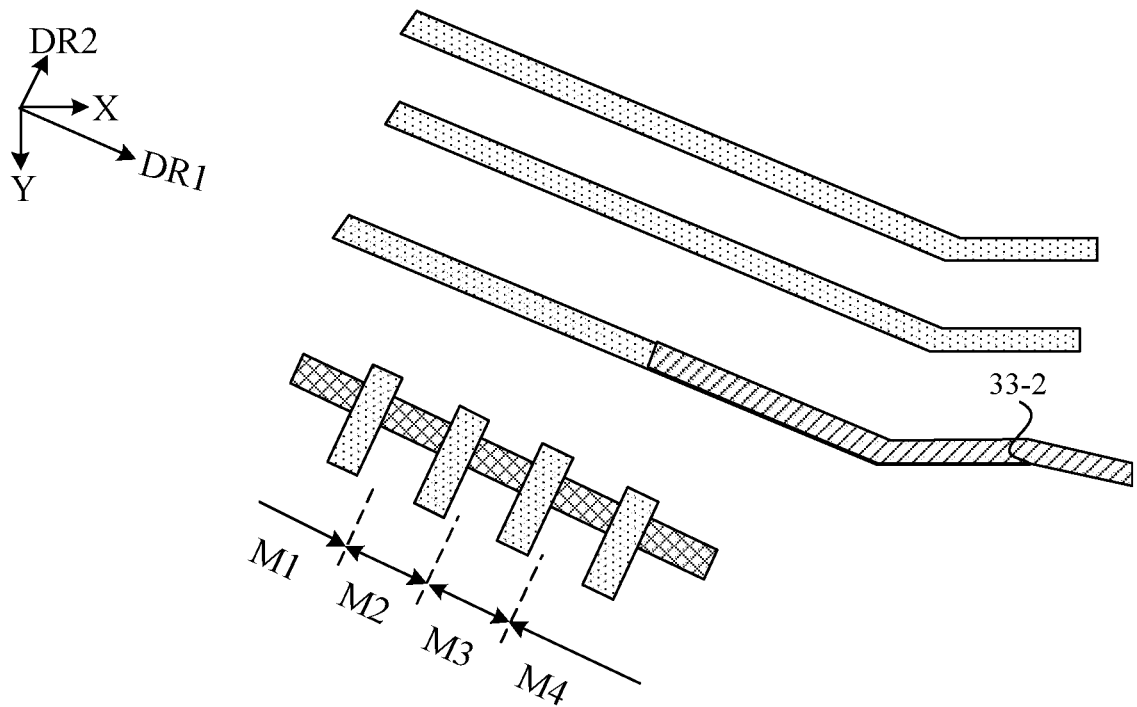
FIG. 5C is a schematic diagram of a structure after a second conductive layer in an ESD protection unit is formed in an exemplary embodiment of the present disclosure.

In an exemplary embodiment, as shown in FIG. 5C, a pattern of a second conductive layer is formed, which may include: a third insulation thin film and a second metal thin film are deposited sequentially on the base substrate on which the afore-mentioned pattern is formed, and the second metal thin film is patterned by a patterning process to form a third insulation layer covering the first conductive layer, and the second conductive layer disposed on the third insulation layer.

In an exemplary embodiment, the third insulation thin film may be called an interlayer dielectric (ILD) layer, and the second conductive layer may be called a second gate metal (Gate2) layer.

In an exemplary embodiment, as shown in FIG. 5C, the third conductive layer may include: a second lead line 33-2. The second lead line 33-2, as the third trace in the electro-static discharge protection line Signal, is connected with the second trace in the electro-static discharge protection line Signal through a via hole, so as to be connected with the first trace in the electro-static discharge protection line Signal which is formed subsequently.

In an exemplary embodiment, the second lead line 33-2 may be at least one of a first broken line, a second broken line, and a third broken line. Herein, an illustration is made in FIG. 5C by taking the second lead line 33-2 being the second broken line as an example, so that the second lead line 33-2 may include: a third sub-line extending along the first inclination direction DR1, a fourth sub-line extending along the first direction X, and a fifth sub-line extending along the third inclination direction DR3, wherein the third sub-line, the fourth sub-line, and the fifth sub-line are connected sequentially.

(4) A pattern of a third conductive layer is formed.

Figure 5D:
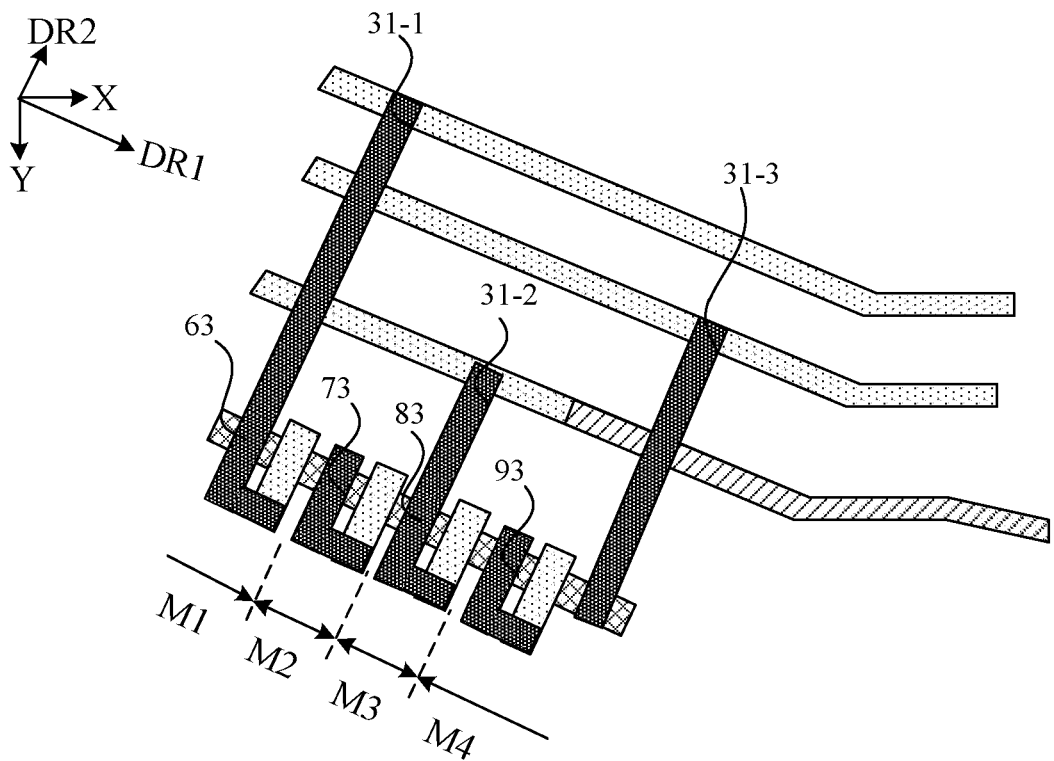
FIG. 5D is a schematic diagram of a structure after a third conductive layer in an ESD protection unit is formed in an exemplary embodiment of the present disclosure.

In an exemplary embodiment, as shown in FIG. 5D, a pattern of a third conductive layer is formed, which may include: a fourth insulation thin film and a third metal thin film are deposited sequentially on the base substrate on which the afore-mentioned pattern is formed, and the third metal thin film is patterned by a patterning process to form a fourth insulation layer covering the second conductive layer, and the third conductive layer disposed on the fourth insulation layer.

In an exemplary embodiment, the fourth insulation thin film may be called an interlayer dielectric (ILD) layer, and the third conductive layer may be called a second gate metal (Gate2) layer.

In an exemplary embodiment, as shown in FIG. 5D, the third conductive layer may include: the first connection line 31-1, the second connection line 31-2, the third connection line 31-3, a first connection electrode 63, a second connection electrode 73, a third connection electrode 83, and a fourth connection electrode 93.

In an exemplary embodiment, as shown in FIG. 5D, the first connection line 31-1, as the first trace in the first voltage signal line VGH, extends along the second inclination direction DR2, so that the first connection line 31-1 is connected with the first extension line 32-1 through a via hole, which may form the first voltage signal line VGH.

In an exemplary embodiment, as shown in FIG. 5D, the second connection line 31-2, as the first trace in the electro-static discharge protection line Signal, may extend along the second inclination direction DR2, so that the second connection line 31-2 is connected with the second extension line 32-2 through a via hole, and the second extension line 32-2 is connected with the second lead line 33-2 through a via hole, which may form the electro-static discharge protection line Signal.

In an exemplary embodiment, as shown in FIG. 5D, the third connection line 31-3, as the first trace in the second voltage signal line VGL, may extend along the second inclination direction DR2, so that the third connection line 31-3 is connected with the third extension line 32-3 through a via hole, which may form the second voltage signal line VGL.

In an exemplary embodiment, as shown in FIG. 5D, the first connection electrode 63 serves as the first electrode of the first transistor M1. The first connection electrode 63 may have an "L" shape, one end of the first connection electrode 63 is connected with a first area of the first active layer 61, and another end of the first connection electrode 63 is connected with the first gate electrode 62 to achieve a connection of the gate of the first transistor M1 and the first electrode of the first transistor M1. The first connection electrode 63 and the first connection line 31-1 may be an integral structure connected to each other, and a connection of the gate of the first transistor M1, the first electrode of the first transistor M1, and the first voltage signal line VGH may be achieved.

In an exemplary embodiment, as shown in FIG. 5D, the second connection electrode 73 serves as the second electrode of the first transistor M1 and the first electrode of the second transistor M2. The second connection electrode 73 may have an "L" shape, one end of the second connection electrode 73 is connected with a second area of the first active layer 61 and a first area of the second active layer 71 at the same time, another end of the second connection electrode 73 is connected with the second gate electrode 72 to achieve a connection of the second electrode of the first transistor M1, the gate of the second transistor M2, and the first electrode of the second transistor M2, that is, to achieve a series connection of the first transistor M1 and the second transistor M2.

In an exemplary embodiment, as shown in FIG. 5D, the third connection electrode 83 serves as the second electrode of the second transistor M2 and the first electrode of the third transistor M3. The third connection electrode 83 may have an "L" shape, one end of the third connection electrode 83 is connected with a second area of the second active layer 71 and a first area of the third active layer 81, and another end of the third connection electrode 83 is connected with the third gate electrode 82 to achieve a connection of the second electrode of the second transistor M2, the gate of the third transistor M3, and the first electrode of the third transistor M3. The third connection electrode 83 and the second connection line 31-2 may be an integral structure connected to each other, and the second electrode of the second transistor M2, achieving connections of the gate of the third transistor M3, and the first electrode of the third transistor M3 with the electro-static discharge protection line Signal.

In an exemplary embodiment, as shown in FIG. 5D, the fourth connection electrode 93 serves as the second electrode of the third transistor M3 and the first electrode of the fourth transistor M4. The fourth connection electrode 93 may have an "L" shape, one end of the fourth connection electrode 93 is connected with a second area of the third active layer 81 and a first area of the fourth active layer 91, and another end of the fourth connection electrode 93 is connected with the fourth gate electrode 92 to achieve a connection of the second electrode of the third transistor M3, the gate of the fourth transistor M4, and the first electrode of the fourth transistor M4.

In an exemplary embodiment, as shown in FIG. 5D, one end of the third connection line 31-3 connected with a second area of the fourth active layer 91 serves as the second electrode of the fourth transistor M4 to achieve a connection of the second electrode of the fourth transistor M4 and the second voltage signal line VGL.

In an exemplary embodiment, the third conductive layer may be made of a metal material. For example, the metal material may include, but is not limited to: any one or more of silver (Ag), copper (Cu), aluminum (Al), and molybdenum (Mo), or an alloy material of the metals listed above, such as aluminum-neodymium alloy (AlNd) or molybdenum-niobium alloy (MoNb), etc. The third conductive layer may be a single-layer structure, or a multi-layer composite structure such as Mo/Cu/Mo or the like.

In an exemplary embodiment, the display area 100 may include: multiple pixel units P arranged in a matrix mode, at least one of the multiple pixel units P may include: a first sub-pixel P1 that emits light of a first color, a second sub-pixel P2 that emits light of a second color, and a third sub-pixel P3 that emits light of a third color. For example, the first sub-pixel P1 may be a red (R) sub-pixel, the second sub-pixel P2 may be a green (G) sub-pixel, and the third sub-pixel P3 may be a blue (B) sub-pixel. Or, at least one of the multiple pixel units P may include a first sub-pixel P1, a second sub-pixel P2, a third sub-pixel P3, and a fourth sub-pixel P4 that emit light of different colors. For example, a pixel unit P may include four sub-pixels, such as a red sub-pixel, a green sub-pixel, a blue sub-pixel, and a white sub-pixel. Here, no limitation is made thereto in the embodiments of the present disclosure.

In an exemplary embodiment, each sub-pixel may include: a pixel drive circuit and a light emitting device. Herein, the pixel drive circuit in the sub-pixel is respectively connected with a gate line, a data line, and an emitting signal line, the light emitting device in the sub-pixel is respectively connected with the pixel drive circuit of the sub-pixel in which the light emitting device is located, the pixel drive circuit is configured to, under control of the gate line and the emitting signal line, receive a data voltage transmitted by the data line, and output a corresponding current to the light emitting device, and the light emitting device is configured to emit light with a corresponding brightness in response to the current outputted by the pixel drive circuit of the sub-pixel in which the light emitting device is located.

In an exemplary embodiment, the pixel drive circuit may be a structure of 3T1C, 4T1C, 5T1C, 5T2C, 6T1C, or 7T1C, etc. Here, no limitation is made thereto in the embodiments of the present disclosure.

In an exemplary embodiment, the multiple sub-pixels in the pixel unit may be arranged in a manner, such as standing side by side horizontally, standing side by side vertically, an X shape, a cross shape, a Delta shape, or the like. For example, taking a pixel unit including three sub-pixels as an example, the three sub-pixels may be arranged in a manner, such as standing side by side horizontally, standing side by side vertically, a Delta shape, or the like. For example, taking a pixel unit including four sub-pixels as an example, the four sub-pixels may be arranged in a manner, such as standing side by side horizontally, standing side by side vertically, a square shape, or the like. Here, no limitation is made thereto in the embodiments of the present disclosure.

Figure 6:
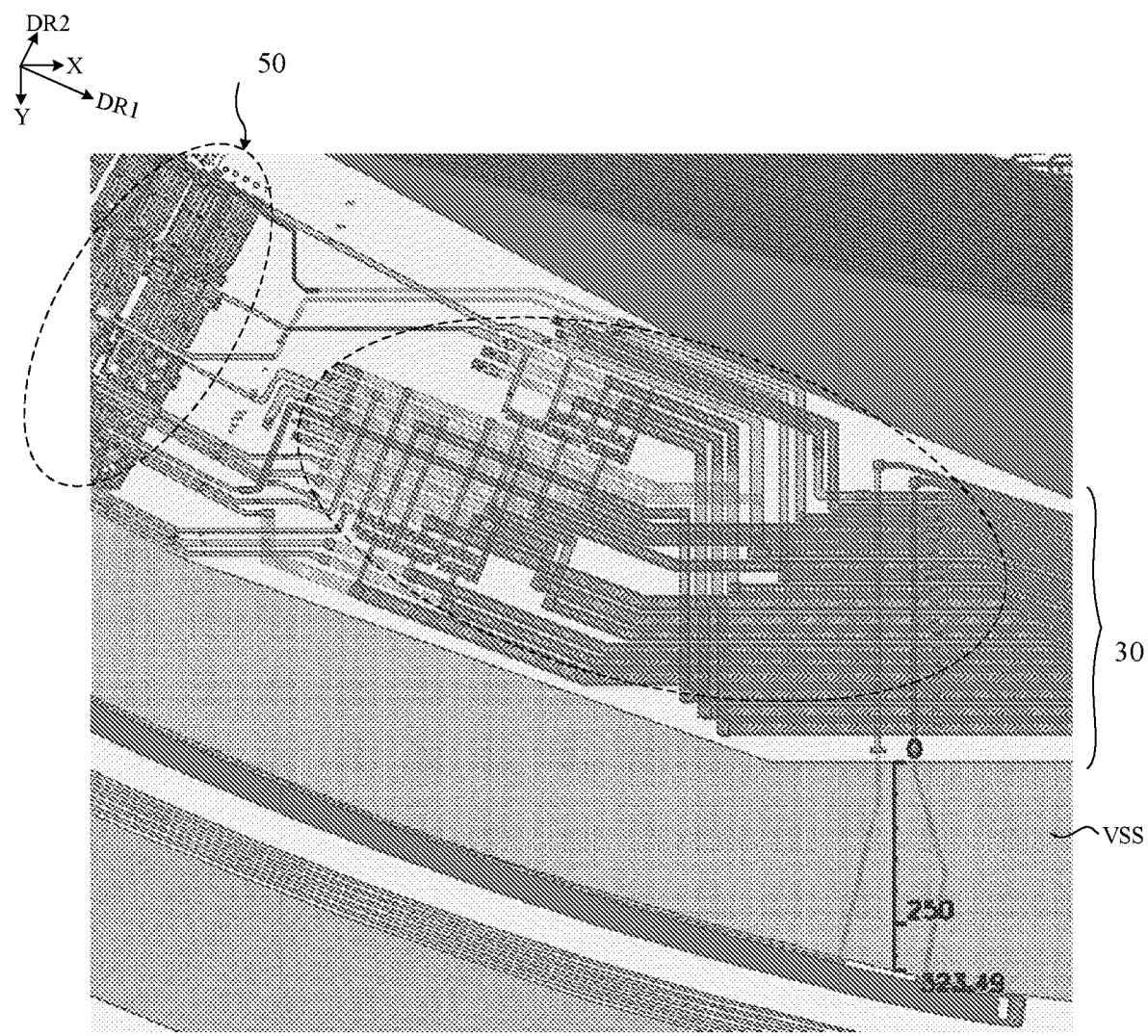
FIG. 6 is a schematic diagram of an arrangement of a first corner area in the display substrate shown in FIG. 2.

FIG. 6 is a schematic diagram of an arrangement of a first corner area in the display substrate shown in FIG. 2, wherein the ESD protection unit 30, the trace, and the GOA unit 50 in FIG. 6 are only an exemplary illustration, and a quantity of ESD protection units does not represent an actual quantity, a quantity of traces does not represent an actual quantity, and a shape of the trace does not represent an actual shape.

As shown in FIG. 6, an arrangement direction of multiple transistors connected in series in the ESD protection unit 30 is set to form a first preset angle with the first direction X, so that the ESD protection unit 30 is disposed obliquely along the first inclination direction DR1, which can, compared with setting the arrangement direction of the multiple transistors connected in series in parallel with the first direction X, reduce wiring space occupied by the ESD protection unit 30 in the first direction X, reduce wiring space occupied by the ESD protection unit 30, and save wiring space occupied by a connection line between the ESD protection unit 30 and the GOA unit 50, and reduce wiring space occupied by the ESD protection unit 30 in the second direction Y, and can avoid occupying wiring space of the first power supply line VSS by the ESD protection unit 30, and thereby a line width of the first power supply line VSS can be increased.

As shown in FIG. 6, taking the GOA unit 50 including multiple cascaded gate shift register units as an example, in addition to the ESD protection unit 30 being disposed obliquely along the first inclination direction DR1, an extending direction of a clock signal line of the gate shift register unit of a last stage may be set to be the same as or approximately the same as the first inclination direction DR1, so that the gate shift register unit of the last stage may be disposed obliquely along the first inclination direction DR1. Thus, wiring space occupied by the gate shift register unit of the last stage in the GOA unit 50 in the first direction X and the second direction Y perpendicular to the first direction X can be reduced, thereby wiring space of the GOA unit can be reduced, wiring space occupied by the connection line between the GOA unit and the ESD protection unit can be further saved, encroaching on another wiring space can be avoided, and uniformity and yield of a product can be effectively improved.

For example, compared with about 291.04 microns of a line width of the first power supply line VSS due to the ESD protection unit 30 arranged along the first direction X in FIG. 1B, the ESD protection unit 30 is disposed obliquely along the first inclination direction DR1 in FIG. 6, which may make the line width of the first power supply line VSS be increased to be about 323.49 microns, so that a current of the first power supply line VSS can be reduced, risk of burning the first power supply line VSS can be reduced, and improving uniformity and yield of a product can be achieved.

An embodiment of the present disclosure also provides a display apparatus. The display apparatus may include: the display substrate in one or more of the above exemplary embodiments.

In an exemplary embodiment, the display apparatus may include, but is not limited to, a Thin Film Transistor-Liquid Crystal Display (TFT-LCD) display apparatus or an Active Matrix Organic Light Emitting Diode (AMOLED) display apparatus, etc. Here, no limitation is made thereto in the embodiments of the present disclosure.

In an exemplary embodiment, the display apparatus may include, but is not limited to, any product or component having a display function such as a mobile phone, a tablet computer, a television, a display, a notebook computer, a digital photo bezel, or a navigator. Here, no limitation is made thereto in the embodiments of the present disclosure.

The above descriptions of embodiments of the display apparatus are similar to the above descriptions of the embodiments of the display substrate, and the embodiments of the display apparatus have similar beneficial effects as the embodiments of the display substrate. Technical details undisclosed in the embodiments of the display apparatus of the present disclosure may be understood by those skilled in the art with reference to the descriptions in the embodiments of the display substrate of the present disclosure, which will not be repeated here.

Although the implementations of the present disclosure are disclosed above, the above contents are only implementations for easily understanding the present disclosure and not intended to limit the present disclosure. Any person skilled in the art to which the present disclosure pertains may make any modification and variation in implementation forms and details without departing from the spirit and scope disclosed in the present disclosure. However, the scope of patent protection of the present disclosure is still subject to the scope defined by the appended claims.

The invention claimed is:

1. A display substrate, comprising: a display area and a non-display area located around the display area, wherein the non-display area comprises: at least one Electro-Static discharge (ESD) protection unit, each ESD protection unit comprises: a plurality of transistors connected in series, a first electrode of each transistor is connected with a gate of the each transistor, and the plurality of transistors are arranged along a first inclination direction, a first preset included angle is provided between the first inclination direction and a first direction, the first preset included angle ranges from 10° to 80°, and the first direction is an extending direction of a gate line in the display area;

wherein the ESD protection unit further comprises: a first voltage signal line, a second voltage signal line, and an electro-static discharge protection line, wherein the first voltage signal line is connected with one transistor located at one end of the ESD protection unit, the second voltage signal line is connected with another transistor located at another end of the ESD protection unit, and the electro-static discharge protection line is connected with any one connection node located between the one transistor and the another transistor;

at least one of the electro-static discharge protection line, the first voltage signal line, and the second voltage signal line comprises: a first trace and a second trace, wherein the first trace is disposed in a same layer as a first electrode and a second electrode of a transistor, the second trace is disposed in a same layer as a gate of the transistor, the first trace extends along a second inclination direction, and the second trace extends along the first inclination direction, the second inclination direction is perpendicular to the first inclination direction;

wherein at least one of the electro-static discharge protection line, the first voltage signal line, and the second voltage signal line further comprises: a third trace, wherein a film layer on which the third trace is located is located between a film layer on which the first trace is located and a film layer on which the second trace is located.

2. The display substrate of claim 1, wherein the plurality of transistors are arranged along the first inclination direction, which comprises: the plurality of transistors are disposed sequentially along the first inclination direction and disposed flush in the second inclination direction.

3. The display substrate of claim 1, wherein the plurality of transistors are arranged along the first inclination direction, which comprises: an active layer of each transistor extends along the first inclination direction, and the first electrode, a second electrode, and the gate of the each transistor all extend along the second inclination direction.

4. The display substrate of claim 3, wherein, in each ESD protection unit, active layers of the plurality of transistors are an integral structure connected to each other.

5. The display substrate of claim 1, wherein the third trace comprises: at least one of a straight line and a broken line, wherein the straight line extends along the first inclination direction, and the broken line comprises at least a trace portion extending along the first inclination direction.

6. The display substrate of claim 5, wherein the broken line comprises at least one of a first broken line, a second broken line, and a third broken line,
the first broken line comprises: a first sub-line extending along the first inclination direction and a second sub-line extending along the first direction, wherein the first sub-line and the second sub-line are connected sequentially;
the second broken line comprises: a third sub-line extending along the first inclination direction, a fourth sub-line extending along the first direction, and a fifth sub-line extending along a third inclination direction, wherein the third sub-line, the fourth sub-line, and the fifth sub-line are connected sequentially, a second preset included angle is provided between the third inclination direction and the first direction, and the second preset included angle is different from the first preset included angle;
the third broken line comprises: a sixth sub-line extending along the first inclination direction and a seventh sub-line extending along a second direction, wherein the sixth sub-line and the seventh sub-line are connected sequentially, and the second direction is an extending direction of a data line in the display area.

7. The display substrate of claim 1, wherein in a direction perpendicular to a plane of the display substrate, the ESD protection unit comprises: a semiconductor layer, a first conductive layer, a second conductive layer, and a third conductive layer that are disposed sequentially on a base substrate, wherein the semiconductor layer comprises: active layers of the plurality of transistors, the first conductive layer comprises: gates of the plurality of transistors and the second trace comprised in at least one of the electro-static discharge protection line, the first voltage signal line, and the second voltage signal line, the second conductive layer comprises: the third trace comprised in at least one of the electro-static discharge protection line, the first voltage signal line, and the second voltage signal line, and the third conductive layer comprises: first electrodes of the plurality of transistors, second electrodes of the plurality of transistors, and the first trace comprised in at least one of the electro-static discharge protection line, the first voltage signal line, and the second voltage signal line.

8. The display substrate of claim 1, wherein the plurality of transistors comprise: a first transistor, a second transistor, a third transistor, and a fourth transistor, wherein a first electrode of the first transistor and a gate of the first transistor are connected with the first voltage signal line; a second electrode of the first transistor, a first electrode of the second transistor, and a gate of the second transistor are connected with a first connection node; a second electrode of the second transistor, a first electrode of the third transistor, a gate of the third transistor, and the electro-static discharge protection line are connected with a second connection node; a second electrode of the third transistor, a first electrode of the fourth transistor, and a gate of the fourth transistor are connected with a third connection node; and a second electrode of the fourth transistor is connected with the second voltage signal line.

9. The display substrate of claim 1, wherein the non-display area comprises: a first bezel area and a second bezel area disposed oppositely in a second direction, a third bezel area and a fourth bezel area disposed oppositely in the first direction, a first corner area connecting the first bezel area and the third bezel area, a second corner area connecting the first bezel area and the fourth bezel area, a third corner area connecting the second bezel area and the third bezel area, and a fourth corner area connecting the second bezel area and the fourth bezel area, wherein at least one of the first corner area to the fourth corner area is an arc-shaped corner area, the ESD protection unit is located in the arc-shaped corner area, and the second direction is an extending direction of a data line in the display area.

10. The display substrate of claim 9, wherein the non-display area further comprises: a first power supply line, wherein a trace portion of the first power supply line located in the arc-shaped corner area comprises: a first sub-trace portion extending along the first inclination direction and a second sub-trace portion extending along the first direction, a width of the second sub-trace portion ranges from 300 microns to 343 microns, and the width refers to a dimension characteristic along the second direction.

11. The display substrate of claim 9, wherein the non-display area further comprises: a Gate Driver on Array (GOA) unit, wherein the GOA unit is connected with the gate line in the display area, and connected with the electro-static discharge protection line in the ESD protection unit.

12. A display apparatus, comprising: the display substrate of claim 1.

* * * * *